(12) United States Patent
Norikane

(10) Patent No.: US 11,442,360 B2
(45) Date of Patent: Sep. 13, 2022

(54) PLANARIZED LAYER FORMING APPARATUS, AND METHOD OF MANUFACTURING ARTICLE

(71) Applicant: CANON KABUSHIKI KAISHA, Tokyo (JP)

(72) Inventor: Hiro Norikane, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 422 days.

(21) Appl. No.: 16/669,974

(22) Filed: Oct. 31, 2019

(65) Prior Publication Data
US 2020/0142299 A1 May 7, 2020

(30) Foreign Application Priority Data
Nov. 5, 2018 (JP) .............. JP2018-208369

(51) Int. Cl.
G03F 7/00 (2006.01)
G03F 7/20 (2006.01)

(52) U.S. Cl.
CPC ........ *G03F 7/0002* (2013.01); *G03F 7/70483* (2013.01)

(58) Field of Classification Search
None
See application file for complete search history.

(56) References Cited

U.S. PATENT DOCUMENTS

| 8,016,585 B2 | 9/2011 | Komoriya |
| 8,394,282 B2 | 3/2013 | Panga |
| 9,529,274 B2 | 12/2016 | Ganapathisubramanian |

FOREIGN PATENT DOCUMENTS

| JP | H118240 A | 1/1999 |
| JP | 2007524505 A | 8/2007 |
| JP | 2009119695 A | 6/2009 |
| JP | 2011529626 A | 12/2011 |
| JP | 2015149484 A | 8/2015 |
| WO | 2005008734 A2 | 1/2005 |
| WO | 2009151560 A2 | 12/2009 |

*Primary Examiner* — Joshua D Zimmerman
(74) *Attorney, Agent, or Firm* — Rossi, Kimms & McDowell LLP

(57) ABSTRACT

A planarized layer forming apparatus operable to use a pressing member to form a planarized layer of a curable composition on a substrate is provided. The apparatus comprises a pressing member holder for holding the pressing member, a substrate holder for holding the substrate, a curing device for curing the curable composition on the substrate, and a chamber for containing the pressing member holder and the substrate holder, and form a sealed space. The curable composition is caused to come into contact with the pressing member. After the contact, holding of the pressing member is released, and a space inside the chamber is pressurized. In a state where holding of the pressing member is released and the space inside the chamber is pressurized, the planarized layer is formed by curing the curable composition by the curing device.

9 Claims, 6 Drawing Sheets

PLANARIZED LAYER FORMING APPARATUS, AND METHOD OF MANUFACTURING ARTICLE

BACKGROUND OF THE INVENTION

Field of the Invention

The present invention relates to a planarized layer forming apparatus and a method of manufacturing an article.

Description of the Related Art

The imprint technique is a technique for forming a pattern of an imprint material onto a substrate (such as a silicon wafer or a glass plate) by curing the imprint material in a state in which the imprint material on the substrate and the mold are in contact with each other and then separating the mold from the cured imprint material. An imprint apparatus using such a technique has attracted attention as a lithography apparatus for mass production of magnetic storage media and semiconductor devices.

A step of manufacturing a device includes a step of etching a substrate on which a pattern has been formed. In such a case, if a residual layer thickness of the pattern formed on the substrate is not uniform over the entire surface of the substrate, the shape of the pattern which is obtained by removing the residual layer (for example, a line width) may become non-uniform. Therefore, there is a need for a technique for planarizing the substrate by making the residual layer thickness uniform. In order to planarize a level difference of the substrate, a technique of forming a coating film using an existing coating machine or the like has been proposed, but sufficient planarizing performance cannot be achieved with respect to a level difference of the substrate on the nanoscale.

In contrast, an apparatus for planarizing a substrate using the imprint technique as described above has been studied (see, for example, Japanese Patent Laid-Open No. 2011-529626 and Japanese Patent Laid-Open No. 2007-524505). In such devices, a planarized layer is formed on a substrate using an unpatterned mold (also referred to as a planar template, superstrate, or the like). In an apparatus for forming a planarized layer using an imprint technique, since a planarizing material (curable composition) is dripped in an amount corresponding to a level difference of a substrate, it is expected that the accuracy of planarization will be improved as compared with existing methods.

Planarization on the substrate must be satisfactory in two respects: the shot region and the entire substrate surface region. More specifically, in the former case, if a level difference caused by the non-uniformity of a base pattern is not suppressed, there is a possibility of deviation from a DOF (Depth of Focus) in a subsequent exposure process. In the latter case, if the thickness of the resin is not made uniform in accordance with the flatness of the substrate itself (thickness unevenness (GBIR; Global backside ideal range) with reference to the back surface of the substrate), variation in the pattern line width after etching will be increased.

The thickness of the planar template used for planarization is desirably made to be as thin as possible (for example, about 200 μm) in order conform to unevenness of the substrate surface by the surface tension of the resin. However, in order to carry the planar template when it is replaced, it is desirable to have a certain thickness (e.g., about 500 μm to 800 μm) from the viewpoint of ease of handling. However, when such a thickness is provided, since the rigidity of the planar template is increased, it is necessary to apply a force from the outside in order to conform to the unevenness of the entire surface of the substrate.

In addition, it is desired that the outer diameter of the planar template be in accordance with an existing facility environment of a semiconductor device manufacturing plant. That is, it is desirable that the outer diameter of the planar template be 12 inches or less, which is an existing substrate size. Otherwise, it would be necessary to update facilities such as by newly preparing a mechanism for transporting a planar template larger than the substrate, a container for accommodating the same, and the like.

However, when planarizing is performed on a 12-inch substrate using the same 12-inch planar template, if the planar template is pressed to the substrate as it is, the film thickness cannot be controlled in a region where the outer periphery of the planar template is held by the vacuum chuck, and the film thickness becomes uneven.

Japanese Patent Laid-Open No. 2011-529626 shows planarizing at the shot region level, but does not disclose a method of making the film thickness uniform at the entire substrate surface region level. In addition, since the apparatus disclosed in Japanese Patent Laid-Open No. 2007-524505 has an apparatus configuration that assumes that the outer diameter of the planar template (sheet 86) is larger than the outer diameter of the substrate 78, it is necessary to take measures with respect to the facility environment in order to planarize the 12-inch substrate as described above.

SUMMARY OF THE INVENTION

The present invention provides, for example, a planarized layer forming apparatus advantageous in accuracy of planarization and support for an existing facility environment.

The present invention in its one aspect provides a planarized layer forming apparatus operable to use a pressing member to form a planarized layer of a curable composition on a substrate, the apparatus comprising a pressing member holder configured to hold the pressing member, a substrate holder configured to hold the substrate, a curing device configured to cure the curable composition on the substrate, and a chamber configured to contain the pressing member holder and the substrate holder, and form a sealed space, wherein the curable composition on the substrate is caused to come into contact with the pressing member, after the contact, holding of the pressing member by the pressing member holder is released, and a space inside the chamber is pressurized, and in a state where holding of the pressing member by the pressing member holder is released and the space inside the chamber is pressurized, the planarized layer is formed by curing the curable composition by the curing device.

Further features of the present invention will become apparent from the following description of exemplary embodiments (with reference to the attached drawings).

DESCRIPTION OF THE EMBODIMENTS

Figure 1:
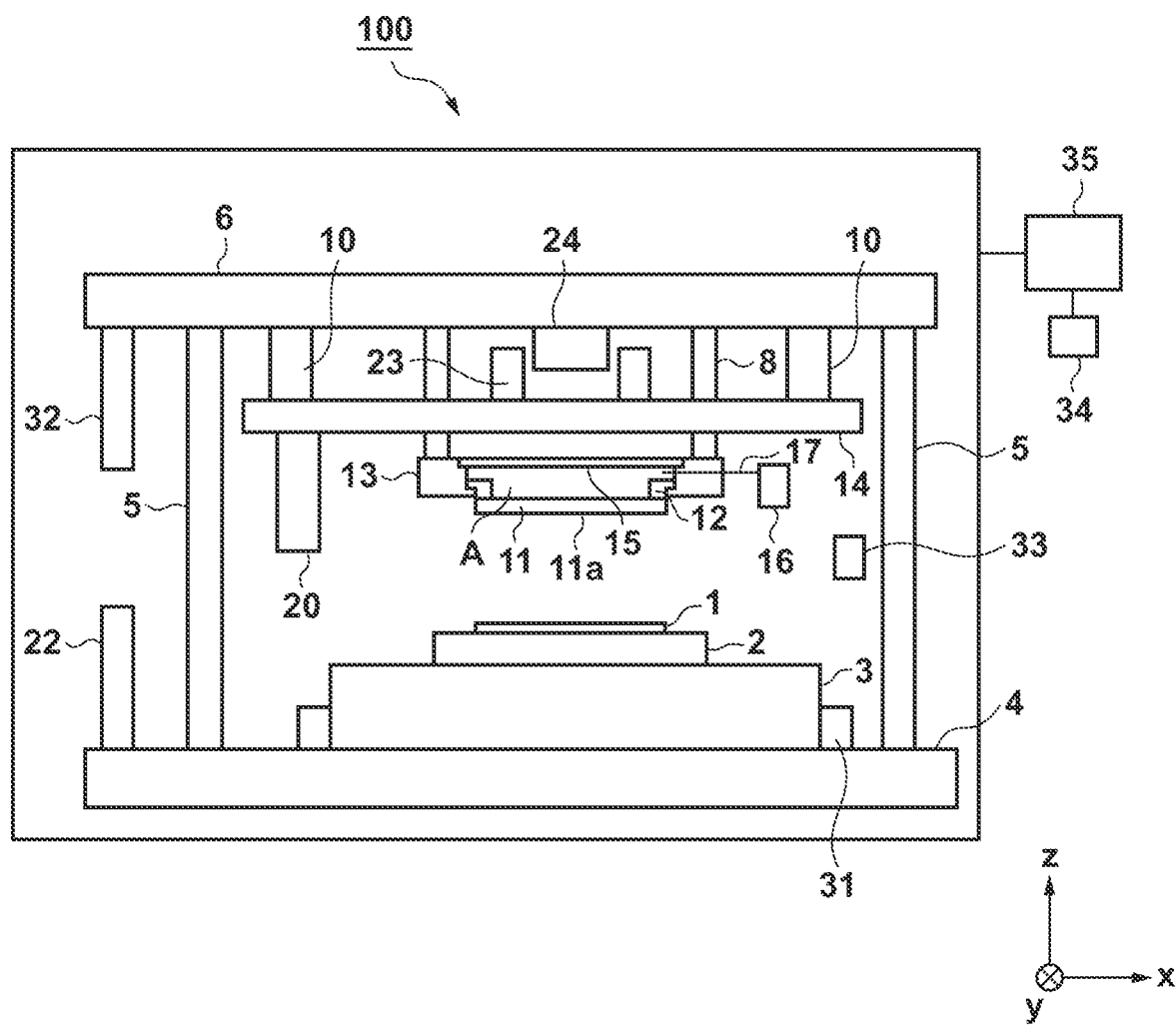
FIG. 1 is a schematic view illustrating a configuration of a planarized layer forming apparatus in an embodiment.

Various exemplary embodiments, features, and aspects of the invention will be described in detail below with reference to the drawings.

Below, description is given in detail for embodiments of the present invention with reference to the drawings. Note that the following embodiments merely illustrate concrete examples of implementing the present invention, and the present invention is not limited to the following embodiments. In addition, not all combinations of characteristic features described in the following embodiments are essential to solve the problems in the present invention. Note that the same reference numerals denote the same members throughout the drawings, and a repetitive description thereof will be omitted.

First Embodiment

The present embodiment relates to a planarized layer forming apparatus for forming a planarized layer on a substrate. FIG. 1 is a schematic view illustrating a configuration of a planarized layer forming apparatus 100 in the present embodiment. Note that, in the present specification and drawings, directions are indicated in an XYZ coordinate system where a direction parallel to a substrate holding surface in accordance with a substrate chuck is set as an XY plane. Directions parallel to the X-axis, Y-axis, and Z-axis in the XYZ coordinate system are respectively referred to as an X direction, a Y direction, and a Z direction.

The planarized layer forming apparatus 100 forms a planarized layer on a substrate, using a mold (a planar template) on which a pattern has not been formed. A base pattern on the substrate has an uneven profile due to a pattern formed by a previous step; in particular in conjunction with memory elements of recent years being made to be structures of multiple layers, there are process substrates that have a level difference on the order of 100 nm. A focus tracking function of a scanning exposure apparatus used in photolithographic process can correct for a level difference due to gentle warping of the entire substrate. However, there is a possibility that fine unevenness of a pitch that falls inside the area of an exposure slit of the exposure apparatus will deviate from a DOF (Depth of Focus) of the exposure apparatus. Conventionally, a method of forming a planarized layer as with SOC (Spin On Carbon) or CMP (Chemical Mechanical Polishing) has been used as a method of smoothing a base pattern of a substrate. However, in the conventional techniques, there is a problem in that sufficient planarizing performance cannot be achieved, and differences of concavities and convexities of an underlying layer due to multi-layering tend to increase further. To solve this problem, the planarized layer forming apparatus of the present embodiment performs localized planarization in a substrate surface after causing a planar template to be in contact with a planarizing material supplied to the substrate in advance. Subsequently, the planarizing material is cured in a state where the planarizing material and the planar template are in contact, and the planar template is caused to separate from the cured planarizing material. By this, a planarized layer is formed on the substrate.

As the planarizing material, a curable composition (to be also referred to as a resin in an uncured state) to be cured by receiving curing energy is used. As curing energy, electromagnetic waves, heat, or the like can be used. Electromagnetic waves can be, for example, light selected from the wavelength range of 10 nm or more and 1 mm or less, for example, infrared light, visible light, or ultraviolet light, or the like. A curable composition can be a composition that is cured by being irradiated with light or by being heated. Of these compositions, a photo-curable composition that is cured by being irradiated with light contains at least a polymerizable compound and a photopolymerization initiator, and may further contain a non-polymerizable compound or a solvent, as needed. A non-polymerizable compound is at least one type of compound selected from a group comprising a sensitizer, hydrogen donor, internal mold release agent, surfactant, antioxidant, and polymer component. The planarizing material may be arranged, on the substrate, in a droplet shape or in an island or film shape formed by connecting a plurality of droplets using a planarizing material supply apparatus (below-described supplying unit 20). The viscosity (the viscosity at 25° C.) of the planarizing material can be, for example, greater than or equal to 1 mPa·s and less than or equal to 100 mPa·s. As a material for a substrate, for example, glass, ceramic, metal, semiconductor, or resin can be used. The surface of a substrate may be provided with a member made of a material different from that of the substrate, as needed. For example, a silicon wafer, a compound semiconductor wafer, silica glass, or the like is used as the substrate.

In FIG. 1, a substrate 1 is loaded from outside of the planarized layer forming apparatus 100 by a substrate conveyance unit 22 that includes a conveyance hand or the like, and is held by a substrate chuck 2 which is a substrate holder. A substrate stage 3 is supported by a base plate 4 and is driven in the X direction and the Y direction in order to position the substrate 1 which is held by the substrate chuck 2 at a predetermined position. A stage driving unit 31 includes a linear motor, an air cylinder, or the like, for example, and drives the substrate stage 3 in at least the X direction and the Y direction. The stage driving unit 31 may have a function for driving the substrate stage 3 in directions of two or more axes (for example, six axial directions). In addition, the stage driving unit 31 includes a rotation mechanism, and can rotationally drive (cause to rotate) the substrate chuck 2 or the substrate stage 3 around an axis parallel to the Z direction.

A planar template 11 which is a pressing member (can also be called a superstrate) has an outer shape that is circular or rectangular seen from above in the Z direction, for example, and a surface thereof is a planar portion 11a. After the planar portion 11a comes into contact with the planarizing material on the substrate, the planar template 11 can deform so as to conform to the surface shape (an uneven shape seen from the X direction or the Y direction) of the substrate 1. In the present embodiment, the outer diameter of the planar template 11 is the same as the outer diameter of the substrate 1. The planar template 11 is conveyed from the outside of the planarized layer forming apparatus 100 by a planar template conveyance unit 32 which includes a conveyance hand or the like, and is held by a head 13 (a pressing member holder). The head 13 includes a planar template holder 12 configured to hold the planar template 11 by attracting a peripheral portion of the planar template 11. For example, holding of the planar template 11 by the planar template holder 12 is performed by vacuum chucking of the peripheral portion of the planar template 11.

The head 13 has a function of supporting the planar template holder 12, and correcting a tilt of the planar template 11. In addition, the head 13 includes a driving mechanism for driving the planar template 11 in a Z-axis direction so as to cause the planar template 11 to come into contact with the planarizing material on the substrate 1, and to separate the planar template 11 from the planarizing material. The driving mechanism can be configured by an actuator such as a linear motor, an air cylinder, or a voice coil motor, for example.

The planarized layer forming apparatus 100 has a curing device 24 for curing the planarizing material on the substrate. In the present embodiment, the curing device 24 can include a light source, a collimating lens, and the like, which are not illustrated.

An opening for letting light (ultraviolet light) irradiated from a light source of the curing device 24 via the collimating lens (not shown) pass through is formed in each of the head 13 and the planar template holder 12. In addition, in the present embodiment, the planar template holder 12 is configured by an optically transparent member to let light pass through. If this is not the case, when the shape and size of the planar template 11 and the substrate 1 are the same, light irradiated from the light source of the curing device 24 is blocked by only a region that faces the planar template holder 12 of the substrate 1, and exposure will be imperfect. Furthermore, a load cell for measuring a pressing force of the planar template 11 with respect to the planarizing material on the substrate can be arranged on the planar template holder 12 or the head 13.

A first flat-plate optical element 15 is arranged between the curing device 24 and the planar template 11. The first flat-plate optical element 15 is configured by an optically transparent member such as a silica glass. The head 13 holds the first flat-plate optical element 15 so as to form a spatial region A which is a closed space between the planar template 11 and the first flat-plate optical element 15. Accordingly, the first flat-plate optical element 15 functions as a sealing member for making the spatial region A be a closed space. A first pressure controller 16 adjusts a pressure in the spatial region A, which is the closed space, via a first pipe 17. It is possible to control the pressure inside this closed space in accordance with the first pressure controller 16.

Supports 5 for supporting a bridge structure 6 are arranged on the base plate 4. Guide bars 8 are suspended from the bridge structure 6, pass through an alignment scope shelf 14 and are fixed to the head 13. The alignment scope shelf 14 is suspended from the bridge structure 6 via supports 10. In addition, although illustration is omitted, a height measurement system (not shown) for using a crazing incidence image shift method for example to measure the height (flatness) of the substrate 1, which is being held by the substrate chuck 2, can be arranged on the alignment scope shelf 14.

An alignment scope 23 includes an image capturing system and an optical system for observing a reference mark provided on the substrate stage 3, and an alignment mark provided on the planar template 11. However, if an alignment mark is not provided on the planar template 11, the alignment scope 23 does not need to be present. The alignment scope 23 measures a relative position between the reference mark provided on the substrate stage 3, and the alignment mark provided on the planar template 11, and is used for alignment for correcting position deviation.

The supplying unit 20 for supplying the planarizing material onto the substrate 1 is configured by a dispenser that includes a discharge port (a nozzle) for discharging the planarizing material (a resin in an uncured state) onto the substrate 1. The supplying unit 20, for example, employs a piezo-jet method, a microsolenoid method, or the like, and can supply a planarizing material having a small volume of approximately 1 pL (picoliter) onto the substrate. In addition, in the present invention, there is no limitation to the number of discharge ports in the supplying unit 20, and it may be one (a single nozzle) or exceed 100. In other words, discharge ports of the supplying unit 20 may be a linear nozzle array, and may be a combination of a plurality of linear nozzle arrays.

A cleaning unit 33 cleans the planar template 11 in a state where the planar template 11 is held by the planar template holder 12. In the present embodiment, the cleaning unit 33 separates the planar template 11 from cured planarizing material on the substrate to thereby remove the planarizing material that attached to the planar template 11 and in particular to the planar portion 11a. The cleaning unit 33, for example, may remove the planarizing material by wiping away the planarizing material that attached to the planar template 11, and may remove the planarizing material using UV irradiation, wet cleaning, dry plasma cleaning, or the like.

A control unit 35 includes a CPU, a memory, and the like, and controls the entirety of the planarized layer forming apparatus 100. The control unit 35 functions as a processing unit for performing a planarization process by comprehensively controlling each unit of the planarized layer forming apparatus 100. Here, a planarization process is processing for planarizing the planarizing material by causing the planar portion 11a of the planar template 11 to come into contact with the planarizing material on the substrate, and having the planar portion 11a conform to the surface shape of the substrate 1. Note that a planarization process is typically performed in units of lots, in other words with respect to each of a plurality of substrates included in the same lot.

Figure 2A:
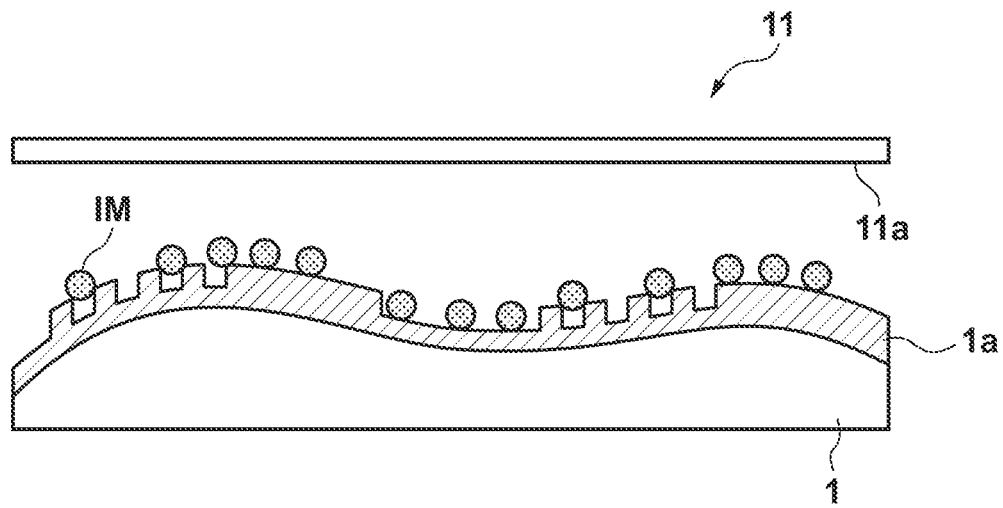
FIGS. 2A to 2C are views for describing a planarization process.
Figure 2B:
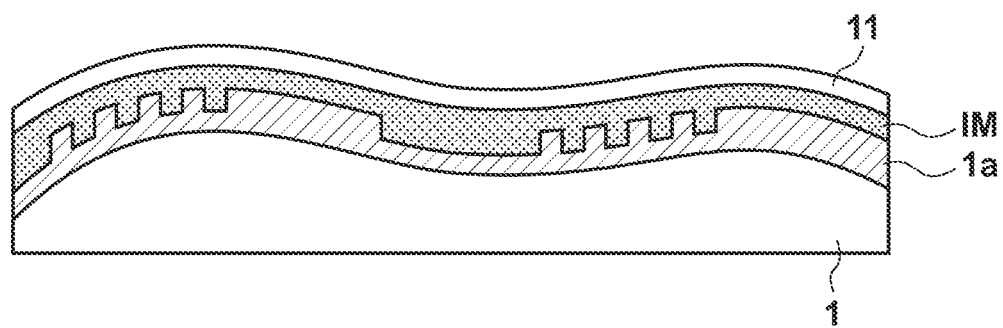
Figure 2C:
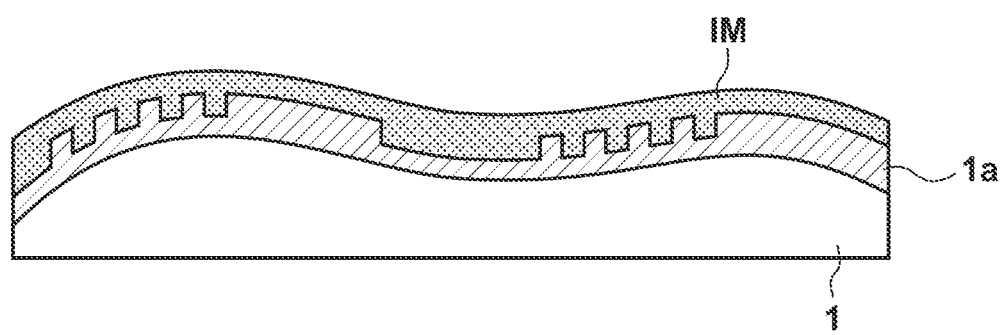

The configuration of the planarized layer forming apparatus 100 in the present embodiment is basically as explained above. Next, with reference to FIGS. 2A to 2C, description is given regarding the planarization process. FIGS. 2A to 2C illustrate a cross-sectional shape of the substrate 1 which is the target of the planarization process. FIG. 2A illustrates a state before the planarizing material on the substrate 1 and the planar template 11 are caused to come into contact. In FIG. 2A, an undercoat layer 1a illustrated by diagonal lines is formed on the substrate 1. The undercoat layer 1a has a level difference such as with a circuit pattern. A planarizing material IM is supplied by the supplying unit 20 onto the undercoat layer 1a. In such a case, the planarizing material IM is arranged on the substrate 1 (on the undercoat layer 1a) in a droplet state, and a state where these droplets are separated from one another is illustrated. Note that a supply pattern of the planarizing material IM is calculated in consideration of unevenness information (level difference information) of the entire surface of the substrate. On an actual substrate, there is unevenness that the substrate itself has and not just a level difference of the pattern of an undercoat layer. Accordingly, it is preferable to decide a supply pattern of the planarizing material IM in accordance with the unevenness of the substrate and the level difference of the pattern of the undercoat layer.

By causing pressure inside the spatial region A which is a closed space to increase in advance in accordance with the first pressure controller 16, a central portion of the planar template 11 is caused to deform in a convex shape toward the substrate 1. By this, contact between the planarizing material IM on the substrate 1 and the planar template 11 is started from a central portion of the planarizing material IM on the substrate 1. Subsequently, the contact gradually proceeds towards the outer circumference of the substrate 1. By this contact, the planarizing material IM is pressed out and forms a continuous film. FIG. 2B illustrates a state in which the planar portion 11a of the planar template 11 is completely in contact with the planarizing material IM on the substrate 1, and the planar portion 11a of the planar template 11 conforms to the surface shape of the substrate 1. In the state illustrated in FIG. 2B, the planarizing material IM is cured by irradiating light onto the planarizing material IM on the substrate 1 via the planar template 11, from the light source of the curing device 24. By this, a layer (a planarized layer) of the planarizing material IM having a uniform thickness is formed on the entire surface of the substrate 1. Finally, as illustrated by FIG. 2C, the planar template 11 is separated from the cured planarizing material IM on the substrate 1.

Figure 3:
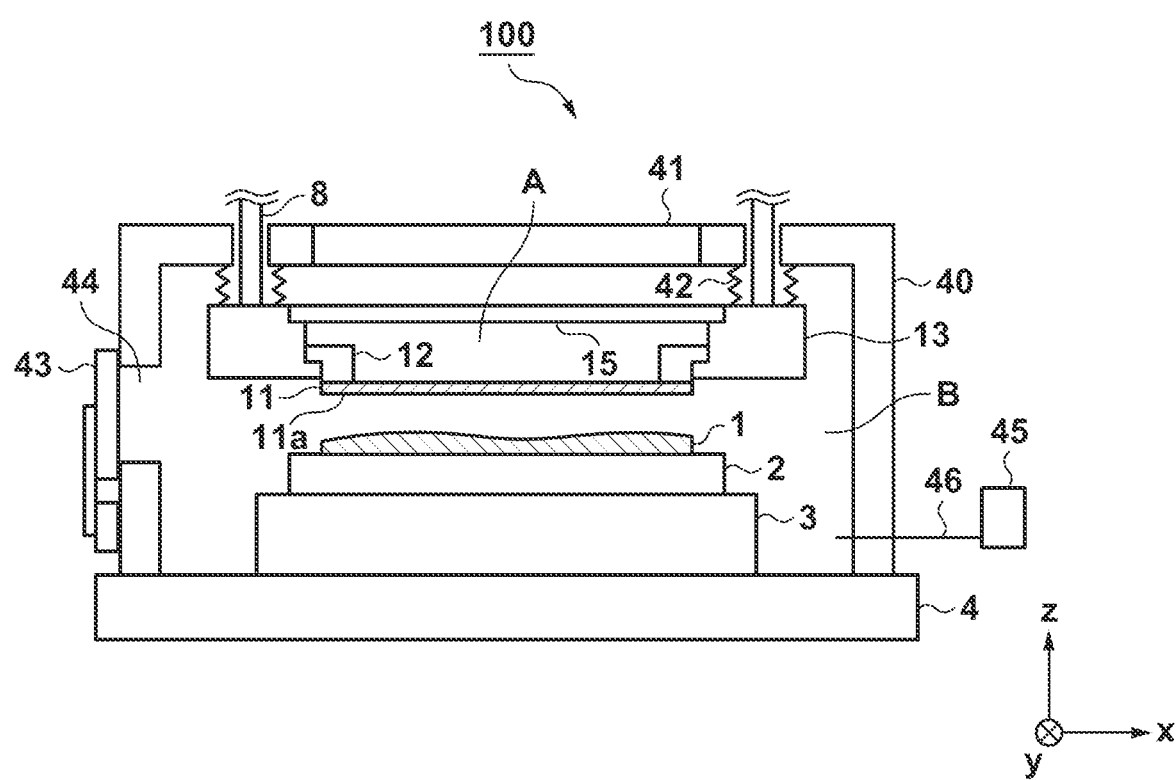
FIG. 3 is a view illustrating an example of a detailed configuration of a periphery of a head of a planarized layer forming apparatus in an embodiment.

FIG. 3 is a view illustrating an example of a detailed configuration of a periphery of the head 13 of the planarized layer forming apparatus 100. In FIG. 3, a second flat-plate optical element 41 forms a portion of a chamber 40, and is configured by a material that can transmit light. The chamber 40 accommodates the planar template 11 and the substrate chuck 2, and forms a sealed space B. The reason why the second flat-plate optical element 41 being configured by a material that can transmit light is to allow light of the light source of the curing device 24 to pass through it, and to make it possible to observe the reference mark of the substrate stage 3 and the alignment mark of the planar template 11 by the alignment scope 23.

The guide bars 8 are inserted into a hollow portion of extensible tubes 42, and the two ends of the extensible tube 42 is connected to the head 13 and the chamber 40. The extensible tubes allow the head 13 to be driven while separating the inside and the outside of the chamber 40. An opening 44 for conveying the substrate 1 and the planar template 11 into and out of the planarized layer forming apparatus 100 is formed on a side wall of the chamber 40. A gate mechanism 43 is a mechanism for opening and closing the opening 44. A sealing member (not illustrated) is provided for the gate mechanism 43, and it is possible to seal the opening 44. By sealing the opening 44, a closed space is formed for the spatial region B in accordance with the chamber 40 (including the second flat-plate optical element 41), the extensible tubes 42, the gate mechanism 43, and the base plate 4. A second pressure controller 45 can adjust pressure inside the spatial region B, which is the closed space, via a second pipe 46.

Figure 4A:
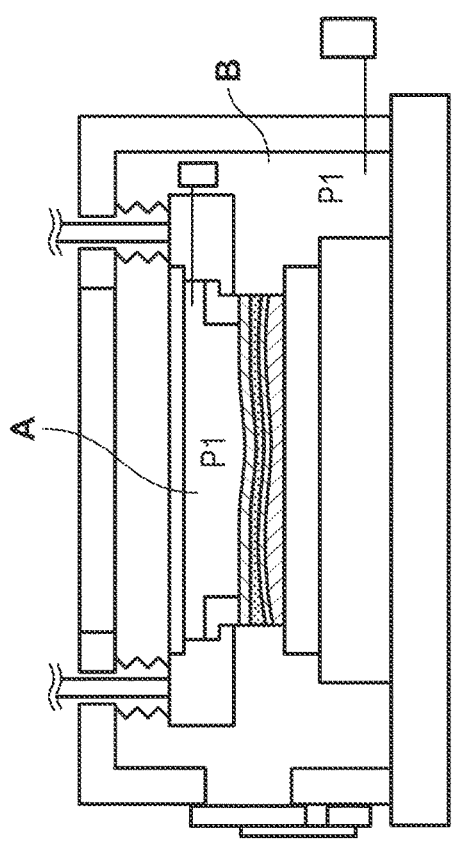
FIGS. 4A to 4D are views for describing a planarization process in an embodiment.

Next, with reference to FIGS. 4A to 4D, description is given for a planarization process in accordance with the planarized layer forming apparatus 100 in the present embodiment. FIG. 4A illustrates a state before the planarizing material IM supplied onto the undercoat layer 1a and the planar template 11 are caused to come into contact. In such a case, the pressure of the spatial region B which is a closed space is set to P0 (for example, atmospheric pressure) in accordance with the second pressure controller 45. The pressure of the spatial region A which is a closed space is set to P1 which is higher than P0 in accordance with the first pressure controller 16 (refer to FIG. 1), so that the planar template 11 becomes a convex shape with respect to the substrate 1. After this deformation is performed, contact between the planarizing material IM and the planar template 11 is started.

Figure 4B:
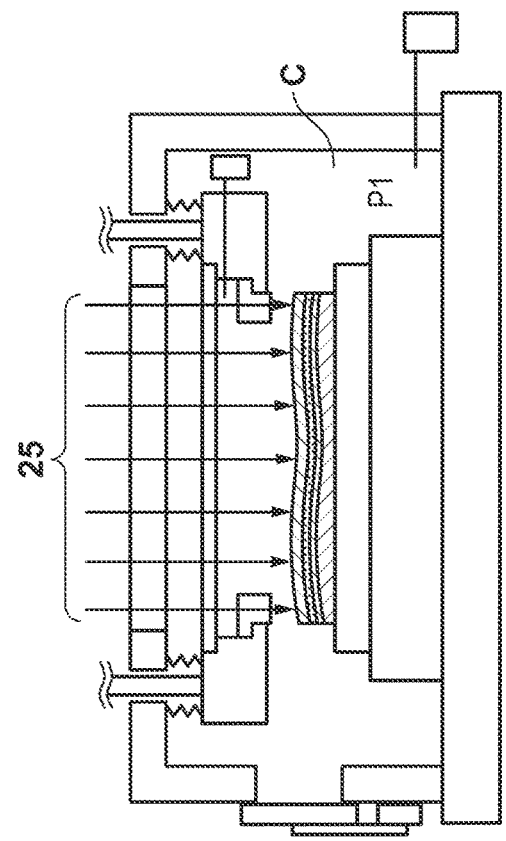

FIG. 4B illustrates a state where the planarizing material IM and the planar template 11 are completely in contact. After the completion of this contact, the pressure of the spatial region B is caused to increase from P0 to P1 in accordance with the second pressure controller 45, to set it to be the same as the pressure of the spatial region A. At this point in time, for a region where the planar template 11 is held by the planar template holder 12, the planar template 11 does not conform to the undercoat layer 1a, and the film thickness of the planarizing material IM can be uneven.

Figure 4C:
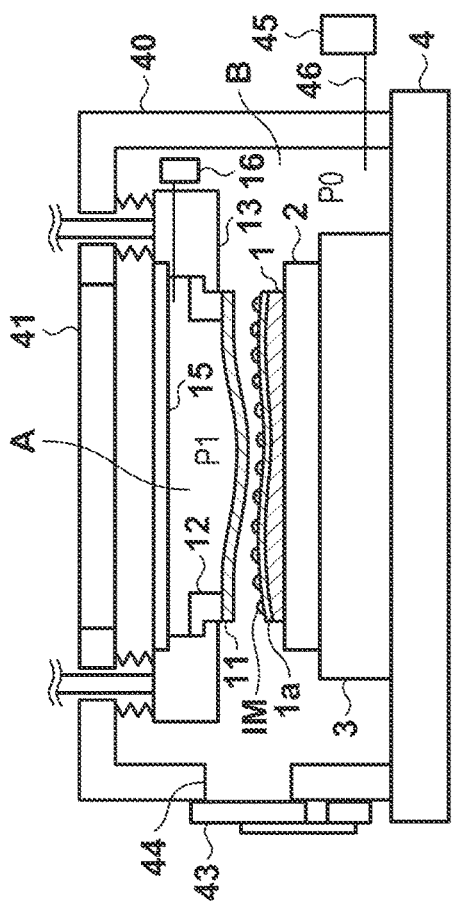

Next, as illustrated by FIG. 4C, the holding of the planar template 11 by the planar template holder 12 is released. By the holding of the planar template 11 by the planar template holder 12 being released, the spatial region A becomes an open space that communicates with the spatial region B, and, inside a spatial region C which is the spatial region A and the spatial region B together becomes uniform at the pressure P1. By this, a pressure with respect to the planar template 11 (including the ends thereof) is applied equally, the planar template 11 conforms to the uneven shape of an underlayer pattern 1a, and the thickness of the planarizing material IM enters an even state. The pressure P1 is in a range that does not exceed 0.2 MPa which is a definition of high-pressure gas as defined in at least Japan, if the planar template 11 is a synthetic quartz glass with a thickness of 0.775 mm, and for example, the pressure P1 is approximately 102 kPa (approximately +10 kPa with respect to atmospheric pressure).

Figure 4D:
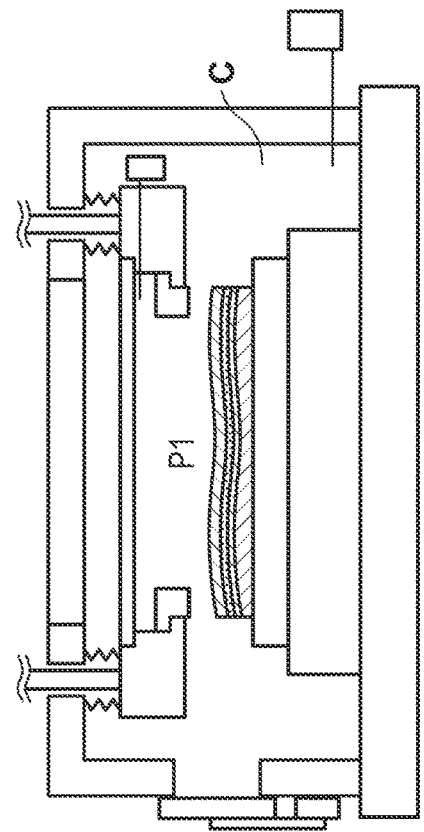

Subsequently, as illustrated by FIG. 4D, in a state where the spatial region C which is the space inside the chamber is pressurized (a state where the pressure P1 is maintained), light 25 is irradiated from the light source of the curing device 24 toward the planar template 11 to cure the planarizing material IM. After the planarizing material IM is cured, the holding of the planar template 11 by the planar template holder 12 is resumed, and the planar template 11 is separated from the planarizing material.

As described above, in the present embodiment, together with pressurizing the space inside the chamber 40, the holding of the planar template 11 by the planar template holder 12 is released. Note that timings of the start of pressurization of the space inside the chamber 40 and the release of the holding of the planar template 11 by the planar template holder 12 may be opposite that described above, and may be simultaneous. By this, it is possible to form a planarized layer having a uniform thickness, across the entirety of the undercoat layer 1a. By obtaining a planarized layer with a uniform thickness, defocus in a subsequent exposure process is suppressed, and, in addition, it is possible to also suppress variation in pattern line width after etching. In addition, as described above, in the present embodiment, the outer diameter of the planar template is the same as the outer diameter of the substrate, and the size of the planar template holder is manufactured to correspond thereto. In other words, in the present embodiment, the outer diameter of the planar template can be adjusted to an existing facility environment of a semiconductor device manufacturing plant. Accordingly, by virtue of the present embodiment, it is possible to provide a planarized layer forming apparatus advantageous in accuracy of planarization and support for an existing facility environment.

Note that, in the embodiment described above, adjustment of the pressure of the space inside the chamber (the spatial region B) and adjustment of the pressure inside the closed space of the back surface of the planar template 11 (the spatial region A) is performed using different pressure controllers. However, there may also be a method that uses only the first pressure controller 16. For example, after holding of the planar template 11 by the planar template holder 12 is released, the spatial region B may be pressurized using the first pressure controller 16 which is used for the pressure of the spatial region A. In such a case, there is an effect that a pressure gradient so as to press the planar template 11 from above will arise, and planarization will be promoted.

Second Embodiment

In the second embodiment, description is given for an example of a different configuration of a chamber for forming a closed space in the spatial region B.

Figure 5:
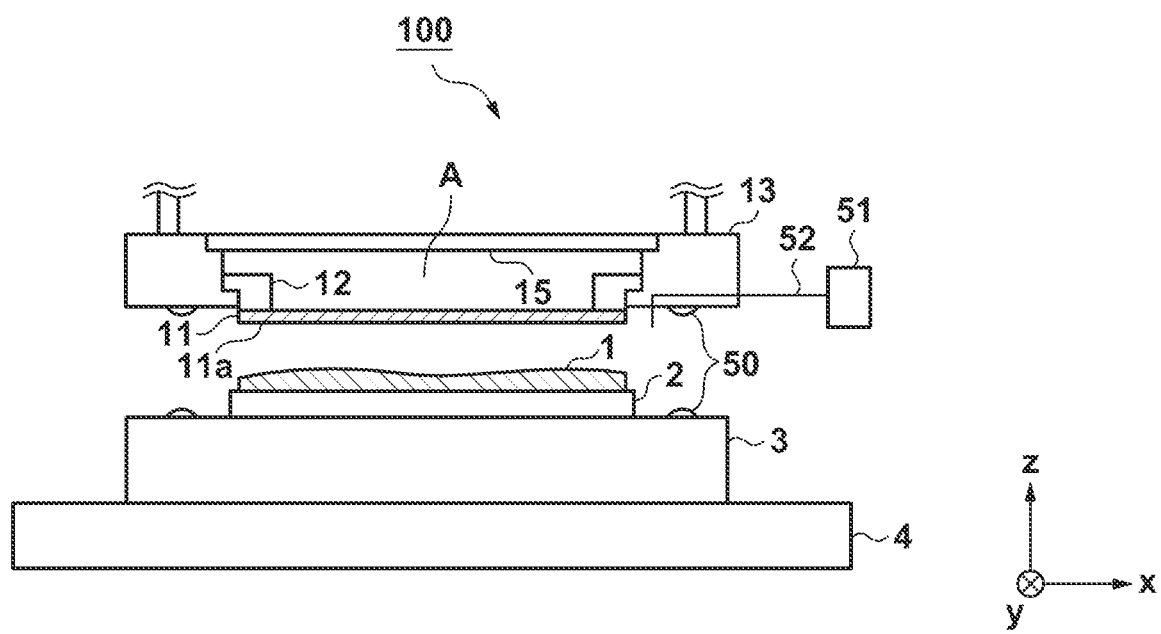
FIG. 5 is a view illustrating an example of a detailed configuration of a periphery of a head of a planarized layer forming apparatus in an embodiment.

FIG. 5 is a view illustrating an example of a detailed configuration of a periphery of the head 13 of the planarized layer forming apparatus 100 in the second embodiment. The planarized layer forming apparatus 100 of FIG. 5 does not have the chamber 40 as illustrated by FIG. 3 and FIGS. 4A to 4D. Instead, the planarized layer forming apparatus 100 of FIG. 5 is provided with extensible members 50 in a region that surrounds the substrate chuck 2 and the planar template holder 12 of the head 13. The extensible members 50 are hollow structures, and it is possible to cause them to expand (extend) by sending compressed gas into a hollow portion in accordance with a compressed gas supplying unit (not illustrated). When the extensible members 50 are caused to expand, the top and bottom extensible members 50 contact each other, and a closed space is formed in the spatial region B thereby. Description is given for a case where the extensible members 50 are hollow structures, but the extensible members 50 do not need to be hollow structures if it is possible to form a closed space in the spatial region B after the planar template 11 and the planarizing material IM come into contact. In addition, an extensible member 50 may be provided on at least one of the head 13 and the substrate stage 3, and extensible members 50 may be provided on both. In the present embodiment as described above, the extensible members 50 form a chamber for forming the spatial region B. A third pressure controller 51 thus adjusts the pressure in the spatial region B, which is the closed space, via a third pipe 52.

Figure 6A:
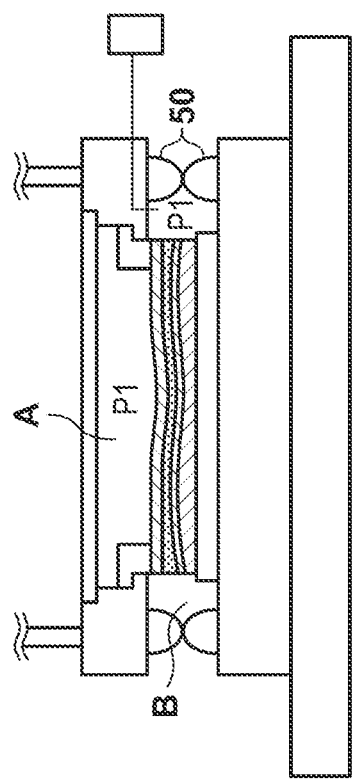
FIGS. 6A to 6D are views for describing a planarization process in an embodiment.

Next, with reference to FIGS. 6A to 6D, description is given for a planarization process in accordance with the planarized layer forming apparatus 100 in the present embodiment. FIG. 6A illustrates a state before the planarizing material IM supplied onto the undercoat layer 1a and the planar template 11 are caused to come into contact. In such a case, the pressure of the spatial region A which is a closed space is set to P1 which is higher than pressure of a surrounding environment region (atmospheric pressure) in accordance with the first pressure controller 16 (refer to FIG. 1), so that the planar template 11 becomes a convex shape with respect to the substrate 1.

Figure 6B:
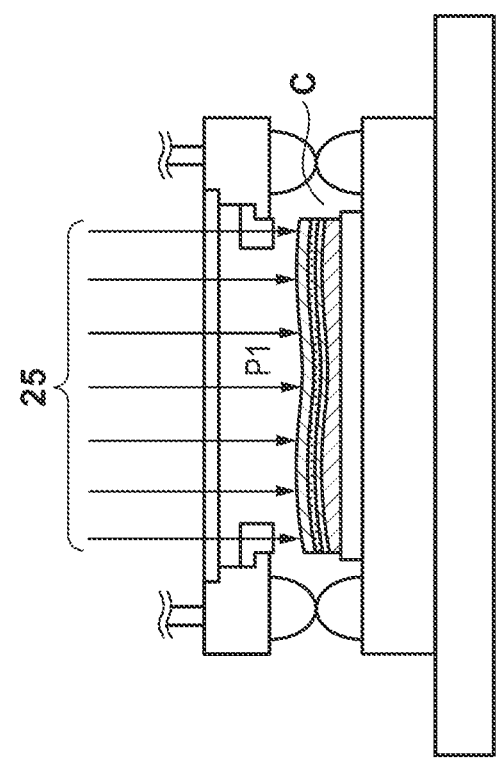

FIG. 6B illustrates a state where the planarizing material IM and the planar template 11 are completely in contact. Once it is confirmed that this state has been entered, the extensible members 50 are caused to expand in accordance with the compressed gas supplying unit (not illustrated), and form the spatial region B which is sealed by the extensible members 50. Subsequently, by the third pressure controller 51, pressure of the spatial region B is set to the pressure P1 which is the same as that of the spatial region A.

Figure 6C:
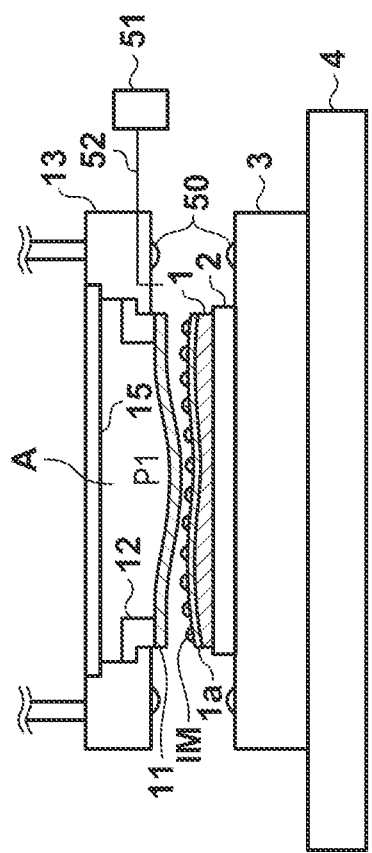

Next, as illustrated by FIG. 6C, the holding of the planar template 11 by the planar template holder 12 is released. By the holding of the planar template 11 by the planar template holder 12 being released, the spatial region A becomes an open space that communicates with the spatial region B, and, inside a spatial region C which the spatial region A and the spatial region B together becomes uniform at the pressure P1. In addition, when the holding of the planar template 11 by the planar template holder 12 is released, by the compressed gas supplying unit (not illustrated), the extensible member 50 is caused to expand more to maintain the formation of the spatial region C. By this, a pressure with respect to the planar template 11 (including the ends thereof) is applied equally, the planar template 11 conforms to the uneven shape of an undercoat layer 1a, and the thickness of the planarizing material IM enters an even state.

Figure 6D:
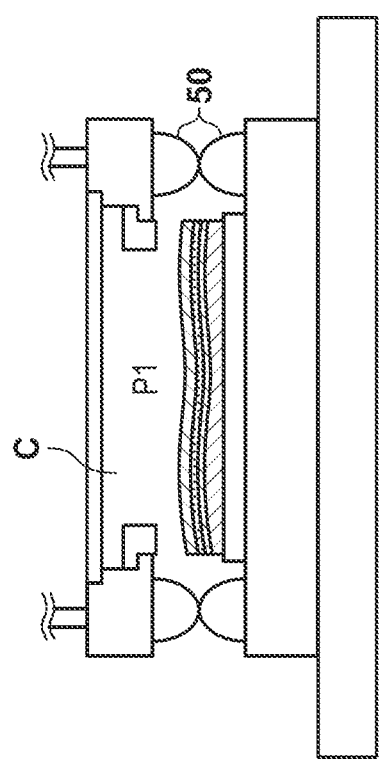

Subsequently, as illustrated by FIG. 6D, in a state where the pressure P1 of the spatial region C is maintained, the light 25 from the light source of the curing device 24 is irradiated toward the planar template 11, and cures the planarizing material IM. By this, it is possible to form a planarized layer having a uniform thickness, across the entirety of the undercoat layer 1a.

The extensible member 50 may be provided on only one of the head 13 and the substrate stage 3 as long as the spatial region B or the spatial region C can be formed.

Embodiment of Method of Manufacturing Article

Next, description is given for a method of manufacturing an article (a semiconductor IC element, a liquid crystal display element, a color filter, a MEMS, or the like) that uses the method of forming a planarized layer or planarized layer forming apparatus that are described above. This method of manufacturing uses the planarized layer forming apparatus or the method of forming a planarized layer described above, and includes a step of causing a composition arranged on a substrate (a wafer, a glass substrate, or the like) to come into contact with a mold, cause planarization, cure the composition, and release the composition and the mold. With respect to a substrate that has a planarized composition, the article is manufactured in accordance with a step for performing processing such as using a lithography apparatus to form a pattern, and processing the processed substrate by another known processing step. The other known step includes etching, resist separation, dicing, bonding, packaging, and the like. By virtue of the present method of manufacturing, it is possible to manufacture an article having higher quality than in the past.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-208369, filed Nov. 5, 2018, which is hereby incorporated by reference herein in its entirety.

What is claimed is:

1. A planarized layer forming apparatus operable to use a pressing member to form a planarized layer of a curable composition on a substrate, the apparatus comprising:
   a pressing member holder configured to hold the pressing member;
   a substrate holder configured to hold the substrate;
   a curing device configured to cure the curable composition on the substrate;
   a chamber configured to contain the pressing member holder and the substrate holder, and form a sealed space; and a sealing member arranged between the curing device and the pressing member, wherein the pressing member holder also holds the sealing member to form a closed space between the pressing member and the sealing member, and, wherein the curable composition on the substrate is caused to come into contact with the pressing member by causing a pressure inside the closed space to increase, causing the pressing member to deform to have a convex shape toward the substrate, after the contact, holding of the pressing member by the pressing member holder is released, and a space inside the chamber is pressurized, and in a state where holding of the pressing member by the pressing member holder is released and the space inside the chamber is pressurized, the planarized layer is formed by curing the curable composition by the curing device.

2. The planarized layer forming apparatus according to claim 1, wherein an outer diameter of the pressing member is the same as an outer diameter of the substrate, and the pressing member holder is configured to hold the pressing member by attracting a peripheral portion of the pressing member.

3. The planarized layer forming apparatus according to claim 1, wherein adjustment of pressure of a space inside the chamber and adjustment of pressure inside the closed space are performed using different pressure controllers.

4. The planarized layer forming apparatus according to claim 3, wherein the contact starts after the pressure inside the closed space is caused to increase by using a first pressure controller to deform the pressing member into a convex shape toward the substrate, and after the contact completes, the space inside the chamber is pressurized using a second pressure controller so that the pressure inside the space inside the chamber is the same as the pressure inside the closed space.

5. The planarized layer forming apparatus according to claim 1, wherein after holding of the pressing member by the pressing member holder is released, a pressure controller used for adjustment of the pressure inside the closed space is used to pressurize the space inside the chamber.

6. The planarized layer forming apparatus according to claim 1, wherein
the curing device cures the curable composition by irradiating light onto the curable composition, and the pressing member holder is formed by an optically transparent member.

7. The planarized layer forming apparatus according to claim 1, wherein, after curing the curable composition, holding of the pressing member by the pressing member holder is resumed, and the pressing member is separated from the curable composition.

8. The planarized layer forming apparatus according to claim 1, further comprising an extensible member provided in a region that surrounds the pressing member holder and the substrate holder, and configured to extend by being supplied with a compressed gas, wherein the chamber is formed by extending the extensible member.

9. A method of manufacturing an article, comprising:
forming a planarized layer on a substrate using a planarized layer forming apparatus including:
a pressing member holder configured to hold the pressing member; a substrate holder configured to hold the substrate;
a curing device configured to cure the curable composition on the substrate; and
a chamber configured to contain the pressing member holder and the substrate holder, and form a sealed space; and
a sealing member arranged between the curing device and the pressing member, wherein the pressing member holder also holds the sealing member to form a closed space between the pressing member and the sealing member, and
wherein the curable composition on the substrate is caused to come into contact with the pressing member by causing a pressure inside the closed space to increase, causing the pressing member to deform to have a convex shape toward the substrate,
after the contact, holding of the pressing member by the pressing member holder is released, and a space inside the chamber is pressurized, and
in a state where holding of the pressing member by the pressing member holder is released and the space inside the chamber is pressurized, the planarized layer is formed by curing the curable composition by the curing device; and
processing the substrate on which the planarized layer has been formed,
wherein the article is manufactured from the processed substrate.

* * * * *